(12) United States Patent
Shiraishi

(10) Patent No.: US 10,122,358 B1
(45) Date of Patent: Nov. 6, 2018

(54) PACKAGED SEMICONDUCTOR DEVICE

(71) Applicant: Mitsubishi Electric Corporation, Tokyo (JP)

(72) Inventor: Takuya Shiraishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/796,878

(22) Filed: Oct. 30, 2017

(30) Foreign Application Priority Data

Apr. 24, 2017 (JP) ................ 2017-085648

(51) Int. Cl.
| | |
|---|---|
| *H02M 7/155* | (2006.01) |
| *H03K 17/567* | (2006.01) |
| *H01L 23/495* | (2006.01) |
| *H01L 23/31* | (2006.01) |
| *H01L 23/00* | (2006.01) |
| *H02H 7/20* | (2006.01) |

(52) U.S. Cl.
CPC ........ *H03K 17/567* (2013.01); *H01L 23/3114* (2013.01); *H01L 23/4952* (2013.01); *H01L 23/49503* (2013.01); *H01L 23/49562* (2013.01); *H01L 23/49575* (2013.01); *H01L 24/48* (2013.01); *H02H 7/205* (2013.01); *H01L 2224/48245* (2013.01); *H01L 2224/48699* (2013.01); *H01L 2924/10272* (2013.01); *H01L 2924/13055* (2013.01); *H01L 2924/13091* (2013.01); *H01L 2924/14252* (2013.01); *H01L 2924/30107* (2013.01)

(58) Field of Classification Search
CPC combination set(s) only.
See application file for complete search history.

(56) References Cited

U.S. PATENT DOCUMENTS 8,824,177 B2 * 9/2014 Godo ................ H01L 23/49575
363/56.12
9,754,863 B2 * 9/2017 Watanabe ......... H01L 23/49537

FOREIGN PATENT DOCUMENTS

JP 2013-106384 A 5/2013

* cited by examiner

*Primary Examiner* — An Luu
(74) *Attorney, Agent, or Firm* — Studebaker & Brackett PC

(57) ABSTRACT

A semiconductor device includes: a transistor including a main terminal and a sense terminal; a main output electrode connected to the main terminal via a first wire; a sense output electrode connected to the sense terminal via a second wire; and a package sealing the transistor, the first and second wires, part of the main output electrode and part of the sense output electrode, wherein a wiring inductance from the main terminal to the main output electrode is larger than a wiring inductance from the sense terminal to the sense output electrode.

8 Claims, 3 Drawing Sheets

PACKAGED SEMICONDUCTOR DEVICE

BACKGROUND OF THE INVENTION

Field

The present invention relates to a semiconductor device including a transistor having a main terminal and a sense terminal.

Background

An emitter current detection scheme is used to protect an IPM of a transfer mold type inverter module or the like against short circuits. Under this scheme, an external shunt resistor is connected to an emitter section of an N-side IGBT, and when a short circuit current is generated, a voltage between shunt resistors is detected and fed back to a control IC to shut off the circuit.

When the emitter current detection scheme is used for a large-capacity type IPM, allowable power of the external shunt resistor needs to be increased. For this reason, a current sense current detection scheme is used which detects a micro current branched from a main current using an IGBT with a built-in on-chip current sense and detects a short circuit current.

Note that it is proposed that in order to reduce current unbalance among a plurality of switching elements connected in parallel to each other, the number of Al wires is adjusted so as to equalize inductances of the respective elements (e.g., see JP 2013-106384 A).

SUMMARY

According to the current sense current detection scheme, a resistor for short circuit current detection is connected to a sense terminal. For this reason, an inductance of an emitter of a main section is smaller than that of a sense section. Therefore, an IGBT gate voltage difference is produced between the main section and the sense section of the IGBT, and the ratio between respective currents flowing through the IGBT varies. For this reason, there is a problem that the accuracy of short circuit current detection deteriorates.

The present invention has been implemented to solve the above-described problem, and it is an object of the present invention to provide a semiconductor device capable of improving accuracy of short circuit current detection.

According to the present invention, a semiconductor device includes: a transistor including a main terminal and a sense terminal; a main output electrode connected to the main terminal via a first wire; a sense output electrode connected to the sense terminal via a second wire; and a package sealing the transistor, the first and second wires, part of the main output electrode and part of the sense output electrode, wherein a wiring inductance from the main terminal to the main output electrode is larger than a wiring inductance from the sense terminal to the sense output electrode.

In the present invention, a wiring inductance from the main terminal of the transistor to the main output electrode is larger than a wiring inductance from the sense terminal to the sense output electrode. Thus, in the current sense current detection scheme in which the resistor for short circuit current detection is connected to the sense terminal, the gate voltage difference between the main section and the sense section of the transistor becomes smaller, and so the ratio between their currents becomes smaller. As a result, it is possible to improve the accuracy of short circuit current detection.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
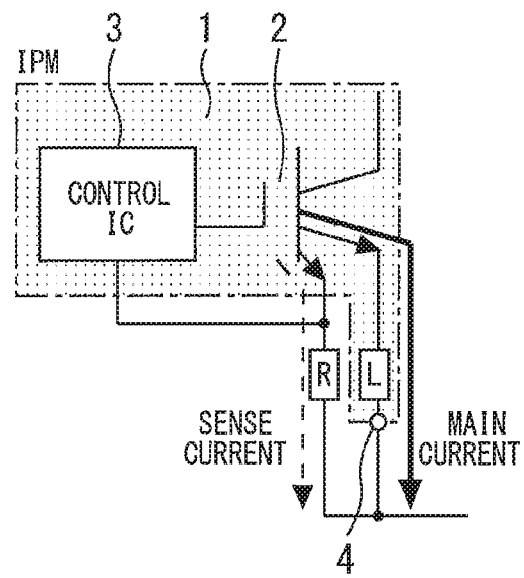
FIG. 1 is a diagram illustrating a semiconductor device according to a first embodiment of the present invention.

FIG. 1 is a diagram illustrating a semiconductor device according to a first embodiment of the present invention. An IGBT 2, a control IC 3 that controls the IGBT 2 and an inductor L connected to an emitter terminal of the IGBT 2 are provided in a package 1. This semiconductor package is an intelligent power module (IPM). The inductor L is connected to an outside of the package 1 via an N-phase output electrode 4.

A resistor R provided outside the package 1 is connected to a sense terminal of the IGBT 2. A short circuit current is detected from a voltage applied to the resistor R and fed back to the control IC 3. Upon detecting a short circuit current, the control IC 3 shuts off the circuit of the IGBT 2.

Figure 2:
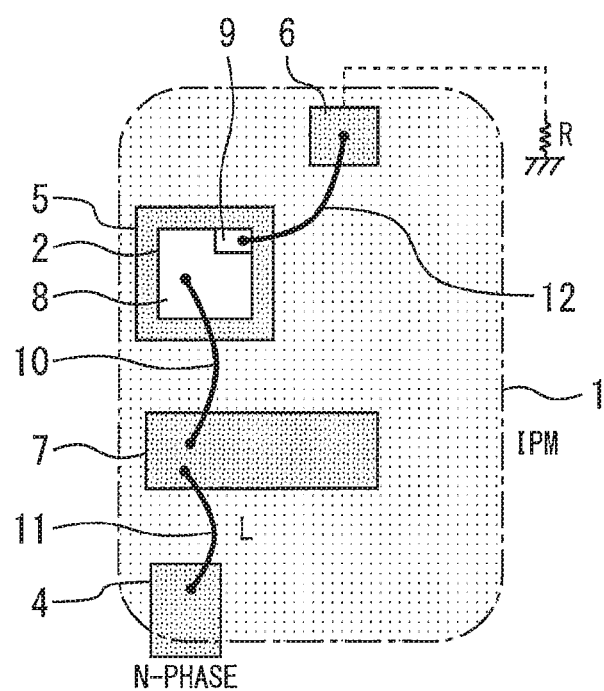
FIG. 2 is a diagram illustrating an interior of the package of the semiconductor device according to the first embodiment of the present invention.

FIG. 2 is a diagram illustrating an interior of the package of the semiconductor device according to the first embodiment of the present invention. A lead frame includes an N-phase output electrode 4, a pad 5, a sense output electrode 6 and a relay electrode 7. The IGBT 2 is provided on the pad 5. The IGBT 2 includes an emitter terminal 8 and a sense terminal 9.

The emitter terminal 8 is connected to the relay electrode 7 via an Al wire 10 and the relay terminal 7 is connected to a sense output electrode 6 via an Al wire 11. The sense terminal 9 is connected to the relay electrode 7 via an Al wire 12. Note that according to the prior art, the sense terminal 9 is connected to the sense output electrode 6 via only the Al wire 10 without going through the relay electrode 7 or the wire 11. The Al wire 11 added in the present embodiment corresponds to the inductor L in FIG. 1.

The package 1 seals the IGBT 2, the Al wires 10, 11 and 12, the pad 5 and the relay electrode 7, part of the N-phase output electrode 4 and part of the sense output electrode 6. Note that the control IC 3 is not shown in FIG. 2.

A total length of the Al wires 10 and 11 is larger than the length of the Al wire 12. Therefore, a wiring inductance from the emitter terminal 8 of the IGBT 2 to the N-phase output electrode 4 is larger than a wiring inductance from the sense terminal 9 to the sense output electrode 6. Thus, in the current sense current detection scheme in which the resistor R for short circuit current detection is connected to the sense terminal 9, the IGBT gate voltage difference between the main section and the sense section of the IGBT 2 becomes smaller, and so the ratio between their currents becomes smaller. As a result, it is possible to improve the accuracy of short circuit current detection.

Second Embodiment

Figure 3:
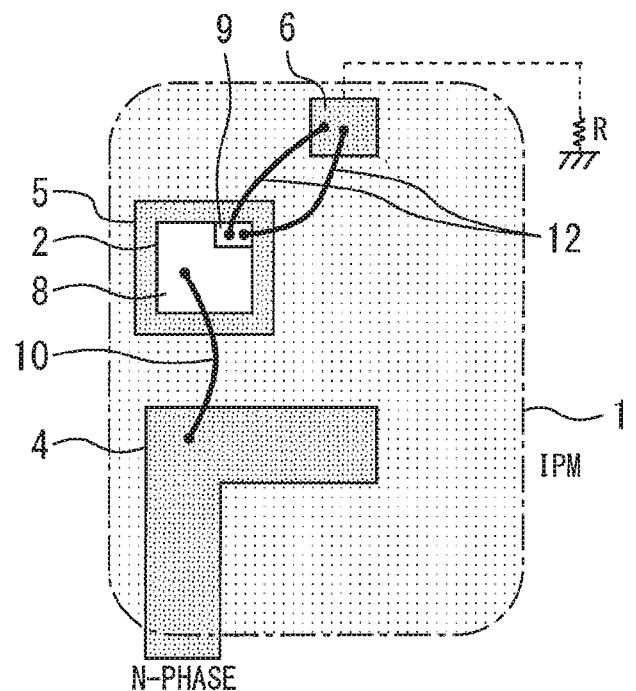
FIG. 3 is a diagram illustrating an interior of a package of a semiconductor device according to a second embodiment of the present invention.

FIG. 3 is a diagram illustrating an interior of a package of a semiconductor device according to a second embodiment of the present invention. Compared to the first embodiment, the present embodiment does not include the relay terminal 7 nor the Al wire 11. Instead, the number of Al wires 12 connecting the sense terminal 9 and the sense output electrode 6 is greater than the number of Al wires 10 connecting the emitter terminal 8 and the N-phase output electrode 4. For this reason, a wiring inductance from the emitter terminal 8 to the N-phase output electrode 4 is larger than a wiring inductance from the sense terminal 9 to the sense output electrode 6. Therefore, it is possible to obtain effects similar to those of the first embodiment.

Third Embodiment

Figure 4:
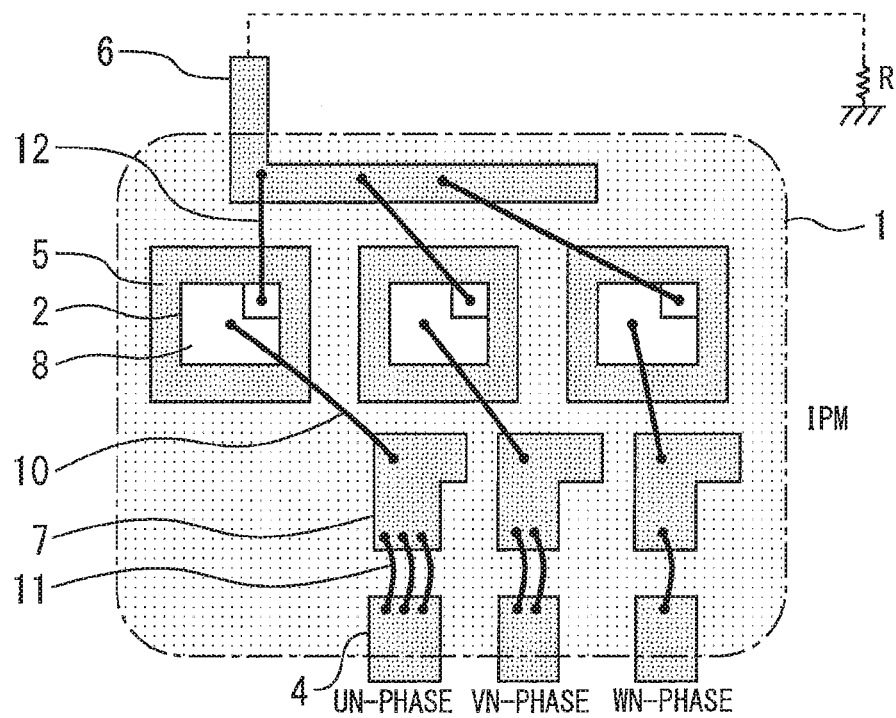
FIG. 4 is a diagram illustrating an interior of a package of a semiconductor device according to a third embodiment of the present invention.

FIG. 4 is a diagram illustrating an interior of a package of a semiconductor device according to a third embodiment of the present invention. The IGBT 2, the N-phase output electrode 4, the relay electrode 7, and the Al wires 10, 11 and 12 are respectively divided into a plurality of phases. Here, they are divided into three phases of UN-phase, VN-phase and WN-phase. The lengths of the Al wires 10 vary among the respective phases according to a positional relationship between the IGBT 2 and the relay electrode 7. Thus, in each phase, if the Al wire 10 becomes longer, the number of Al wires 11 is increased and the length of the Al wire 12 of the sense section is shortened. This makes it possible to reduce the difference in a wiring inductance between the phases and reduce inter-phase variations.

However, among the respective phases, a wiring inductance from the emitter terminal 8 of the IGBT 2 to the N-phase output electrode 4 is made greater than a wiring inductance from the sense terminal 9 to the sense output electrode 6. This makes it possible to obtain effects similar to those of the first embodiment.

Fourth Embodiment

Figure 5:
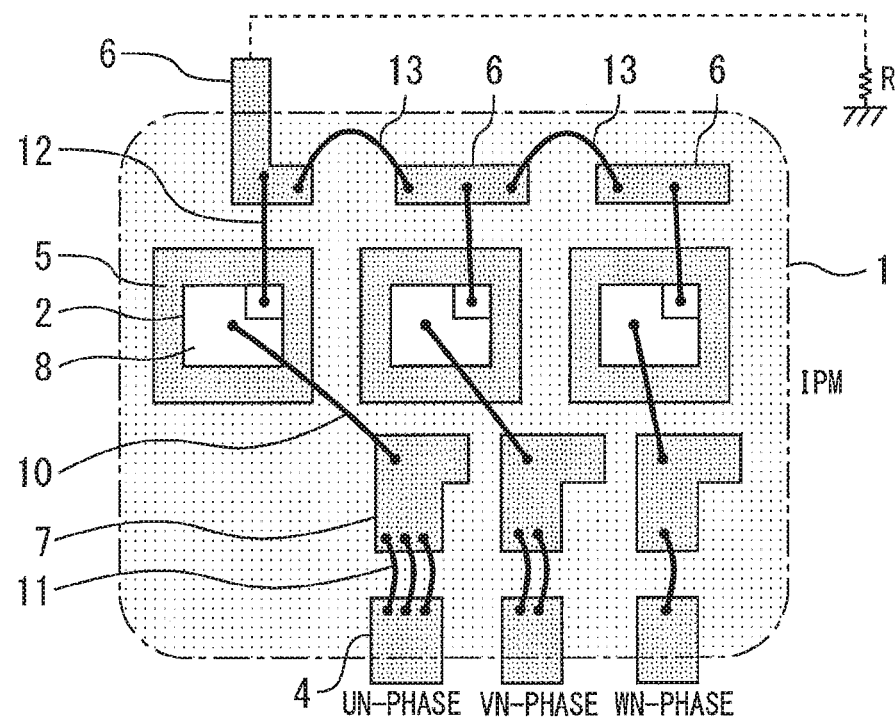
FIG. 5 is a diagram illustrating an interior of a package of a semiconductor device according to a fourth embodiment of the present invention.

FIG. 5 is a diagram illustrating an interior of a package of a semiconductor device according to a fourth embodiment of the present invention. The sense output electrode 6 is divided into a plurality of frames, which are mutually connected via wires 13. The sense terminals 9 of the IGBTs 2 of the respective phases are connected to the divided frames respectively.

According to the third embodiment, the length of the Al wire 12 of each sense section is adjusted for each phase, whereas according to the present embodiment, the length of the Al wire 13 connecting the frames of the divided sense output electrodes 6 is adjusted for each phase. This makes it possible to obtain effects similar to those in the third embodiment.

Fifth Embodiment

Figure 6:
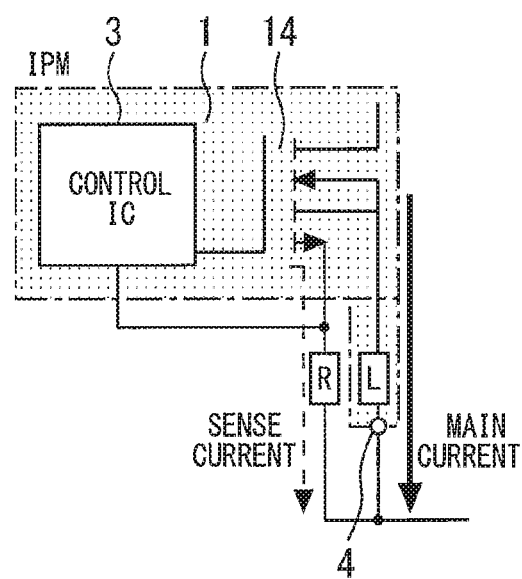
FIG. 6 is a diagram illustrating a semiconductor device according to a fifth embodiment of the present invention.

FIG. 6 is a diagram illustrating a semiconductor device according to a fifth embodiment of the present invention. A SiCMOS transistor 14 is used instead of the IGBT 2 of the first embodiment. Compared to the IGBT 2, the SiCMOS transistor 14 has a wider operating temperature range and has a greater branching ratio variation due to temperature characteristics. Therefore, it is possible to obtain more remarkable effects by applying the present invention to a SiC mounting module.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-085648, filed on Apr. 24, 2017 including specification, claims, drawings and summary, on which the Convention priority of the present application is based, is incorporated herein by reference in its entirety.

The invention claimed is:

1. A semiconductor device comprising:
   a transistor including a main terminal and a sense terminal;
   a main output electrode connected to the main terminal via a first wire;
   a sense output electrode connected to the sense terminal via a second wire; and
   a package sealing the transistor, the first and second wires, part of the main output electrode and part of the sense output electrode,
   wherein a wiring inductance from the main terminal to the main output electrode is larger than a wiring inductance from the sense terminal to the sense output electrode.

2. The semiconductor device according to claim 1, further comprising:
   a control IC controlling the transistor and provided in the package; and
   a resistor provided outside the package and connected to the sense output electrode,
   wherein the control IC shuts off the transistor upon detecting a short circuit current from a voltage applied to the resistor.

3. The semiconductor device according to claim 1, wherein a length of the first wire is larger than a length of the second wire.

4. The semiconductor device according to claim 1, wherein the number of wires of the second wire is greater than the number of wires of the first wire.

5. The semiconductor device according to claim 3, further comprising a relay electrode provided in the package,
   wherein the first wire includes a third wire connecting the main terminal to the relay electrode, and a fourth wire connecting the relay electrode to the main output electrode.

6. The semiconductor device according to claim 5, wherein the transistor, the main output electrode, the relay electrode, and the second, third and fourth wires are respectively divided into a plurality of phases, and
   in each phase, if the third wire becomes longer, the number of wires of the fourth wire is increased.

7. The semiconductor device according to claim 6, wherein the sense output electrode is divided into a plurality of frames, which are mutually connected via fifth wires, and
the sense terminals of the transistor of the respective phases are connected to the divided frames respectively.

8. The semiconductor device according to claim 1, wherein the transistor is a SiCMOS transistor.

* * * * *